(12) United States Patent
Buchtmann et al.

(10) Patent No.: US 10,766,153 B2
(45) Date of Patent: Sep. 8, 2020

(54) CUTTING INSTRUMENT, COATING AND METHOD

(71) Applicant: Acme United Corporation, Fairfield, CT (US)

(72) Inventors: Larry Buchtmann, Goldsboro, NC (US); Gary Pia, Stratford, CT (US)

(73) Assignee: Acme United Corporation, Fairfield, CT (US)

( * ) Notice: Subject to any disclaimer, the term of this patent is extended or adjusted under 35 U.S.C. 154(b) by 1 day.

(21) Appl. No.: 15/822,702

(22) Filed: Nov. 27, 2017

(65) Prior Publication Data

US 2018/0133909 A1 May 17, 2018

Related U.S. Application Data

(63) Continuation of application No. 13/402,051, filed on Feb. 22, 2012, now abandoned, which is a continuation of application No. 11/960,626, filed on Dec. 19, 2007, now abandoned, and a continuation-in-part of application No. 11/337,976, filed on Jan. 23, 2006, now Pat. No. 8,245,407, which is a continuation of application No. 10/720,578, filed on Nov. 24, 2003, now Pat. No. 6,988,318.

(60) Provisional application No. 60/870,787, filed on Dec. 19, 2006.

(51) Int. Cl.
*B26B 13/00* (2006.01)
*C23C 14/06* (2006.01)
*C23C 14/34* (2006.01)
*B26B 9/00* (2006.01)
*B26D 1/00* (2006.01)
*C23C 30/00* (2006.01)
*B26D 1/04* (2006.01)
*B26D 1/30* (2006.01)

(52) U.S. Cl.
CPC ............... *B26B 13/00* (2013.01); *B26B 9/00* (2013.01); *B26D 1/0006* (2013.01); *C23C 14/0635* (2013.01); *C23C 14/0641* (2013.01); *C23C 14/0664* (2013.01); *C23C 14/3414* (2013.01); *C23C 30/00* (2013.01); *C23C 30/005* (2013.01); *B26D 1/045* (2013.01); *B26D 1/30* (2013.01); *B26D 2001/002* (2013.01); *B26D 2001/004* (2013.01)

(58) Field of Classification Search
CPC .................... B26B 13/00; C23C 14/06664
USPC ................................. 30/146, 196, 344, 345
See application file for complete search history.

(56) References Cited

U.S. PATENT DOCUMENTS

| | | | | |
|---|---|---|---|---|
| 4,436,830 A | * | 3/1984 | Andreev | B23B 27/148 501/96.1 |
| 4,670,172 A | * | 6/1987 | Sproul | C10M 173/02 508/511 |
| 4,981,756 A | * | 1/1991 | Rhandhawa | A61B 17/00 427/327 |
| 5,152,774 A | * | 10/1992 | Schroeder | A61B 17/3201 148/537 |

(Continued)

*Primary Examiner* — Jennifer B Swinney
(74) *Attorney, Agent, or Firm* — Alix, Yale & Ristas, LLP

(57) ABSTRACT

A new and improved cutting instrument is provided having an enhanced coating. The coating includes titanium, chromium, nitrogen and carbon elements and provides increased wear resistance. The coating can be applied to a variety of metal and non-metallic substrates, which include scissors and knife blades.

19 Claims, 12 Drawing Sheets

(56) References Cited

U.S. PATENT DOCUMENTS

| | | | | |
|---|---|---|---|---|
| 5,301,431 A * | 4/1994 | Cera | ............... | A61B 17/8863 |
| | | | | 30/186 |
| 5,580,429 A * | 12/1996 | Chan | ............... | C23C 14/325 |
| | | | | 204/192.38 |
| 6,076,264 A * | 6/2000 | Meckel | ............... | A45D 29/00 |
| | | | | 30/225 |
| 6,440,150 B1 * | 8/2002 | Hipp | ............... | A61B 17/3201 |
| | | | | 427/2.1 |
| 6,575,671 B1 * | 6/2003 | North | ............... | C22C 29/08 |
| | | | | 407/118 |
| 6,866,921 B2 * | 3/2005 | Grab | ............... | C22C 29/08 |
| | | | | 407/119 |
| 6,988,318 B2 * | 1/2006 | Buchtmann | ............... | B26B 13/00 |
| | | | | 30/346 |
| 2002/0029910 A1 * | 3/2002 | Heinrich | ............... | C22C 29/005 |
| | | | | 175/394 |
| 2002/0032073 A1 * | 3/2002 | Rogers | ............... | A63B 53/04 |
| | | | | 473/324 |
| 2002/0166606 A1 * | 11/2002 | Caminiti | ............... | B32B 15/012 |
| | | | | 148/212 |
| 2005/0130793 A1 * | 6/2005 | Doll | ............... | F16H 48/08 |
| | | | | 475/331 |
| 2006/0222893 A1 * | 10/2006 | Derflinger | ............... | C23C 14/0641 |
| | | | | 428/698 |
| 2007/0111032 A1 * | 5/2007 | Nagano | ............... | C23C 14/024 |
| | | | | 428/698 |
| 2007/0172675 A1 * | 7/2007 | Omori | ............... | C23C 30/005 |
| | | | | 428/469 |

* cited by examiner

| Sample No. | Target Composition | Average Hardness (Gegapascals) | Hardness Range (Gegapascals) | Appearance |
|---|---|---|---|---|
| 1 | None | 5.9 | 5.4 - 6.3 | Medium gloss silver |
| 2 | 100% Ti | 7.0 | 5.8 - 7.2 | Satin gold |
| 3 | 75% Ti / 25% Cr | 7.3 | 5.8 - 8.8 | Satin gold |
| 4 | 50% Ti / 50% Cr | 7.4 | 7.2 - 7.6 | Satin silver |
| 5 | 25% Ti / 75% Cr | 7.4 | 5.7 - 9.1 | Satin silver |
| 6 | 100% Cr | 7.9 | 6.5 - 9.3 | Medium gloss silver |
| 7 | 90% Ti / 10% Cr | 6.5 | 6.1 - 6.9 | Satin gold |
| 8 | 60% Ti / 40% CR | 7.1 | 6.8 - 7.4 | Satin gold |
| 9 | 25% Ti / 75% Cr | 7.4 | 6.9 - 7.9 | Satin silver |
| 10 | 10% Ti / 90% Cr | 9.0 | 8.9 - 9.1 | Medium gloss silver |

* Shank formed of heat-treated 420 stainless steel in all samples.

Fig. 5

Relative Ratio
Table 1 – 1.0Cr/0.0Ti

| Sample | CH4:N2 | NanoHardness Gpa | Modulus Gpa | Color |
|---|---|---|---|---|
| 11 | 0:1 | 17.6 | 194 | Silver |
| 12 | 1:2 | 22.65 | 250 | Silver |
| 13 | 2:1 | 20.7 | 186 | Silver |
| 14 | 1:0 | 15.65 | 170 | Silver |

FIG. 11A

Relative Ratio
Table 2 – 0.75Cr/0.25Ti

| Sample | CH4:N2 | NanoHardness Gpa | Modulus Gpa | Color |
|---|---|---|---|---|
| 15 | 0:1 | 16.7 | 134 | Silver |
| 16 | 1:2 | 32.2 | 259 | Silver |
| 17 | 2:1 | 12 | 124 | Silver |
| 18 | 1:0 | 9.35 | 125 | Blue Silver |

FIG. 11B

Relative Ratio
Table 3 – 0.5Cr/0.5Ti

| Sample | CH4:N2 | NanoHardness Gpa | Modulus Gpa | Color |
|---|---|---|---|---|
| 19 | 0:1 | 14.7 | 125 | Silver |
| 20 | 1:2 | 17.5 | 148 | Silver |
| 21 | 2:1 | 12.6 | 104 | Silver |
| 22 | 1:0 | 26.3 | 220 | Silver |

FIG. 11C

Relative Ratio
Table 4 – 0.25Cr/0.75Ti

| Sample | CH4:N2 | NanoHardness Gpa | Modulus Gpa | Color |
|---|---|---|---|---|
| 23 | 0:1 | 11.5 | 100 | Golden |
| 24 | 1:2 | 15.95 | 132 | Medium Silver |
| 25 | 2:1 | 12.76 | 110 | Silver |
| 26 | 1:0 | 35.22 | 258 | Silver |

FIG. 11D

Relative Ratio
Table 5 – 1.0Ti/0.0Cr

| Sample | CH4:N2 | NanoHardness Gpa | Modulus Gpa | Color |
|---|---|---|---|---|
| 27 | 0:1 | 14.1 | 160 | Golden |
| 28 | 1:2 | 12 | 136 | Blue Gray |
| 29 | 2:1 | 10.35 | 130 | Bronze |
| 30 | 1:0 | 10.25 | 112 | Silver |

FIG. 11E

CUTTING INSTRUMENT, COATING AND METHOD

CROSS REFERENCE TO RELATED APPLICATIONS

This application is a continuation of U.S. application Ser. No. 13/402,051 filed Feb. 22, 2012, which is a continuation-in-part of U.S. application Ser. No. 11/337,976 filed Jan. 23, 2006, incorporated by reference herein in its entirety, which in turn is a continuation of U.S. application Ser. No. 10/720,578 filed Nov. 24, 2003, incorporated herein by reference.

This application also is a continuation of U.S. application Ser. No. 11/960,626 filed Dec. 19, 2007, incorporated by reference herein in its entirety, which claims priority to U.S. Provisional Patent Application No. 60/870,787, filed on Dec. 19, 2006 and U.S. patent application Ser. No. 11/231,259, filed on Sep. 20, 2005.

This application is related to U.S. application Ser. No. 11/231,151, titled "Coating for Cutting Implements", filed on Sep. 20, 2005 and herein incorporated by reference in its entirety, which is a continuation-in-part of U.S. Pat. No. 6,988,318, issued Jan. 24, 2006 and incorporated by reference in its entirety.

BACKGROUND

Substantial effort has been expended in improving the construction and operation of stationery cutting implements for household and office use. Ever increasing demands have been placed on manufacturers of these products to increase the ease of use, the wear resistance, and the ease with which the products can be cleaned, while maintaining a competitive price. For example, typical household and office scissors have been unable to achieve a long-lasting cutting edge, which withstands the wide-variety of products being cut, at a competitive price.

A cutting instrument is typically formed of a suitable substrate material, such as stainless steel, and a cutting edge is often formed with a wedge-shaped configuration. The edge sharpness varies greatly depending upon the intended use of the instrument. Cutting instruments include, by example, scissors, knife blades, and paper trimmers, each of which can have varied uses. Furthermore, each of these types of instruments can have a significant number of sub-classes, for which the blades can vary widely depending upon the intended use, the price point, and intended consumer. Extended use of the instrument often results in a dulling and wearing effect. Hard coatings are often used to increase wear resistance and hardness of the cutting instrument. It would be advantageous for a cutting instrument to have an improved hard, tough, wear-resistant coating.

SUMMARY

It is an object of the present invention to provide a cutting implement having a coating that provides one or more of improved wear resistance, increased hardness, pleasing appearance, reduced user effort, and increased stain resistance.

These and other objects of the present invention are provided by a cutting implement comprising a pair of cutting blades and a coating. The coating comprises titanium chromium nitride, which provides the cutting blades with a satin silver appearance.

A cutting implement having a pair of complementary cutting blades and a titanium chromium nitride coating is also provided. The titanium chromium nitride coating is disposed on each of the cutting blades. The titanium chromium nitride coating has a thickness in a range between about 0.3 and 0.5 microns, a surface roughness in a range of about 15 to 25.times.10.sup.-6 inch/inch, and a hardness in a range of about 5.7 to about 9.1 gigapascals.

Another embodiment is a cutting instrument comprising a cutting blade comprising steel, and a coating disposed directly on the cutting blade, the coating comprising at least a first layer comprising an amorphous material including carbon, titanium, chromium, and nitrogen, wherein at least some of the chromium is in the form of chromium carbonitride and titanium chromium carbonitride and at least some of the titanium is in the form of titanium carbonitride, and further wherein the coating comprises the elements chromium and titanium in a weight ratio in the range of 3:1 to 1:3.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

FIG. 5 is a data table of testing results of various exemplary embodiments of a coating of the present invention for the scissors of FIG. 1;

FIGS. 11A-11E each contain a table (1-5), which provides coating composition data and corresponding hardness values for the coatings in accordance with multiple embodiments of the present invention.

DETAILED DESCRIPTION

Figure 1:
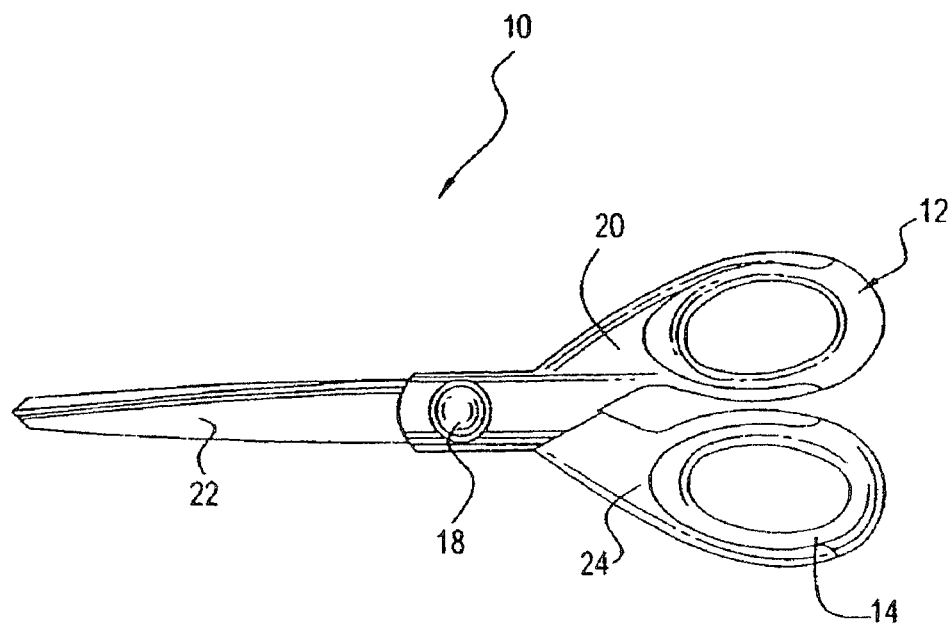
FIG. 1 is a first side view of an exemplary embodiment of a pair of scissors.
Figure 2:
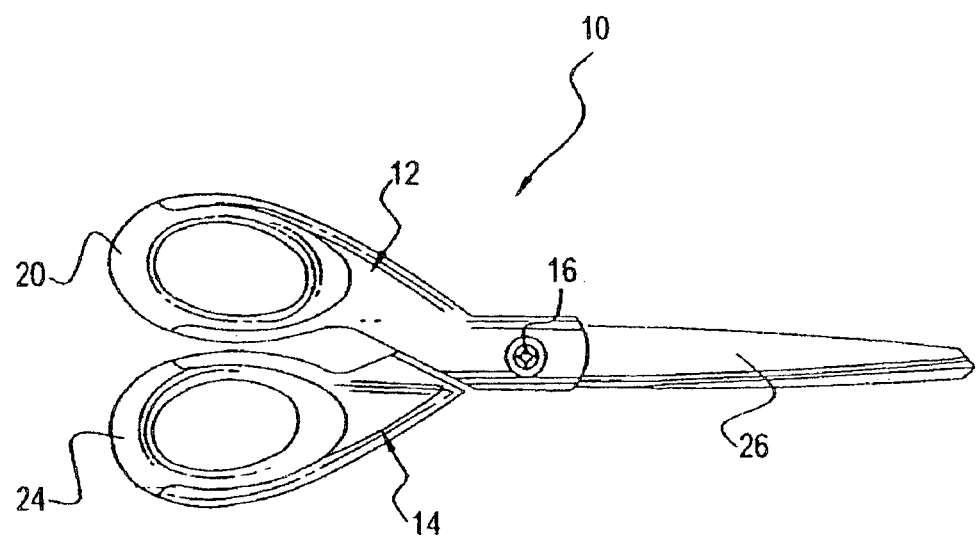
FIG. 2 is a second, opposite side view of FIG. 1.

Referring now to the figures and in particular to FIGS. 1 and 2, a cutting implement in the form of pair of scissors generally indicated by reference numeral 10 is illustrated.

Scissors 10 have a first half 12 pivotally connected to a second half 14. First and second halves 12, 14 are pivotally connected by conventional connection means, such as a screw 16 and a post 18. First half 12 can have a handle 20 and a blade 22. Similarly, second half 14 can have a handle 24 and a blade 26.

Each blade 22, 26 has a cutting edge 28. Preferably, cutting edge 28 is formed by way of a bevel 30 disposed on each blade 22, 26, respectively. Thus, scissors 10 provide a pair of complementary cutting blades 22, 26 for cutting stationery products, such as paper, cardboard, Bristol board, and others.

Handles 20, 24 are preferably overmolded onto blades 22, 26, respectively. However, it should be recognized that each half 12, 14 of scissors 10 is described as having separate handles 20, 24 overmolded onto blades 22, 26, respectively. Of course, it is contemplated by the present invention that each half 12, 14 have a unitary handle and blade portion.

Figure 3:
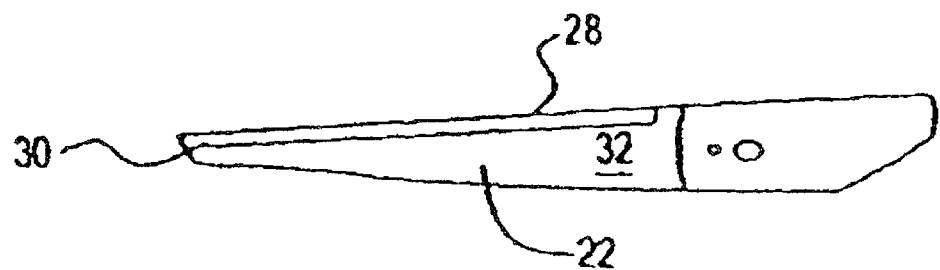
FIGS. 3 and 4 are side views of the blades of FIG. 1.
Figure 4:
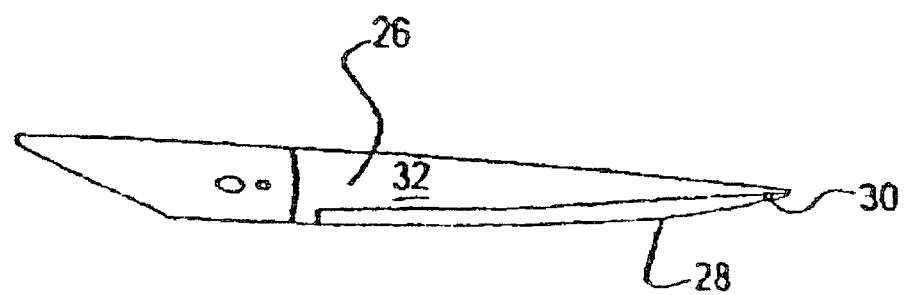

Blade 22 is illustrated in FIG. 3, while blade 26 is illustrated in FIG. 4. Blades 22, 26 are preferably made of steel, more preferably stainless steel, such as 420 stainless steel. In addition, blades 22, 26 can be heat-treated to further increase the hardness of the blades.

Scissors 10 further include a coating 32 disposed on each blade 22, 26. Coating 32 provides cutting edges 28 with extremely tough, hard, wear resistant characteristics. The increased hardness of cutting edges 28 provides scissors 10 with substantially increased longevity, while also providing the scissors with corrosion resistance, as well as providing a smooth and uniform appearance and color. For example, scissors 10 having coating 32 were subjected to cycle testing of 10,000 openings and closings without showing any signs of wear to the coating.

In addition, coating 32 provides scissors 10 with an aesthetically acceptable color or appearance. Specifically, coating 32 differentiates blades 22, 26 having coating 32 from uncoated blades. Coating 32 does not change the color of blades 22, 26 to the point that the consumer no longer recognizes scissors 10 as being useable for general household and office use. However, coating 32 has an appearance sufficient to allow the consumer to recognize that the coating is present on scissors 10.

Further, coating 32 increases the ease of use of scissors 10 by providing blades 22, 26 with a smooth surface finish, which reduces friction between the blades during use. Thus, blades 22, 26 have less friction between the two inside blade faces, which provides a smoother cutting action and less cutting effort than in blades without coating 32.

Coating 32 is selected from the group consisting of titanium nitride (TiN), chromium nitride (CrN), and titanium chromium nitride (TiCrN). More preferably, coating 32 is a multiple component barrier of titanium chromium nitride.

Coating 32 is disposed on blades 22, 26 such that the coating forms a metallurgical bond with the blades, which resists flaking, blistering, chipping, and peeling. In fact, coating 32 is absorbed into the surface layer of the metal of blades 22, 26. Coating 32 is disposed on blades 22, 26 with a thickness in a range between about 0.3 and 0.5 microns, more preferably about 0.4 microns.

Referring to FIGS. 3-4 blades 22, 26 have a cutting edge 28. The cutting edge can be in-part formed from a bevel 30 disposed on one side of each blade 22, 26. The bevel 30 can be straight or arcuately shaped. Alternatively, the bevel (not shown) can comprise two or more surfaces that are straight or arcuately shaped. Depending upon the use of the cutting instrument 10, the bevel 30 can be alternately shaped. Cutting instrument 10 provides a pair of complementary cutting blades 22, 26 for cutting a variety of materials.

In some embodiments, the blades 22, 26 are manufactured from steel. Alternatively, the blades 22, 26 are manufactured from stainless steel, such as 420 stainless steel. In an alternative embodiment, the blades 22, 26 can be heat-treated to further increase the hardness of the underlying blade substrate. The blade substrate is the underlying blade material that does not include the coating. In an alternative embodiment, the blade substrate can be selected from Damascus steel, carbon steel, surgical stainless steel, galvanized steel, thermo mechanically treated (TMT) steel and steel alloys.

FIG. 5 illustrates the test results for a range of compositions and processes for coating 32. Sample 11 is a control or uncoated blade formed of heat-treated 420 stainless steel. Heat-treated 420 stainless steel blades were also used in Samples 12 through 20.

In Samples 2 through 6, the blades were coated using a first process. Twelve (12) blades of each sample coating were prepared with a thickness of about 5.0 micrometers. In Samples 7 through 10, the blades were coated using a second process. All of the samples were then tested for surface smoothness, hardness, and color. The results of this testing are provided in FIG. 5.

The concentration of coating 32 in all samples were tested and were in the range of about +/−3 to 4 percent of the target composition. The testing also showed that both the elements are uniformly deposited and there is no segregation or isolation of each to any particular region in the film.

The first process was a reactive magnetron sputtering with a pulsed dc source. The second process comprised a cathode arc plasma (CAP) process. The sputtering gas mixture in each process was argon and nitrogen.

In the first process, a four-inch circular target is used with a pulsed dc power supply. The target was a combination target having one or more 90-degree sections of pure titanium and chromium. For example, in Sample #3 the target is three 90-degree sections of pure titanium and one 90-degree section of pure chromium.

In the second process, two different targets were used simultaneously, with each target being pure titanium and chromium.

The partial pressure of argon during the first process was maintained between 0 to 1 millitorr and that of nitrogen was maintained at 1 to 2 millitorr with the total sputtering gas pressure maintained between 2 to 3 millitorr. The stainless steel chamber was evacuated to 2.times.10.sup.-5 Torr prior to the deposition. Cleaning of the target was carried with argon alone. The sputtering current was kept at 0.3 amps during cleaning that was carried out for 3 minutes in all depositions. Deposition of the films on the blades during cleaning was prevented by a shutter that was withdrawn soon after cleaning the target. The sputtering current was chosen at two different values, 0.5 amperes and 0.7 amperes. Depositions were performed for two different total sputtering times, 15 minutes and 30 minutes. The resulting thickness of the films was found to be 0.3 micrometers and 0.6 micrometers, respectively. The deposition temperature has been optimized for the following conditions. Stainless steel scissors blades should not soften and therefore deposition temperature was kept at a temperature of about 150.degree. and 200.degree. C.

The hardness of the samples was measured using a Vickers microhardness test according to American Society of Testing and Materials (ASTM) E384, last revised March 2001. Here, a diamond indenter is loaded to a desired amount, which causes the indenter to indent the sample. The indentation is measured and converted to a hardness value. The indenter is a three-sided, pyramid shaped diamond probe tip with angle of 136.degree. The hardness values of FIG. 5 represent the hardness of each sample with load of about 50 grams, with a load of about 400 grams for the uncoated sample 1.

The results of FIG. 5 show that the coated samples (samples 2 to 10) are generally harder than the uncoated sample (sample 1). For example, sample 4 is about 125% harder than sample 1. Further, the results of FIG. 5 show that the hardness of the coated samples (samples 2 to 10) generally tends to increase as the content of chromium increases.

In addition, the results of FIG. 5 show that the silver appearance generally tends to increase as the content of chromium increases.

The samples having a majority of chromium (e.g., samples 6 and 10) had a gloss silver appearance, which was substantially similar to that of uncoated samples 1. In fact, it has been determined that consumers did not recognize that the scissors having a gloss silver appearance (e.g., the samples having a majority of chromium) had any coating at all.

In contrast, the samples having a majority of titanium (e.g., samples 2, 3, 7 and 8) had a satin gold appearance. Here, it has been determined that consumers recognized scissors having a satin gold appearance (e.g., the samples having a majority of titanium) as being for uses other than general household and office use. Namely, these scissors appear to the consumer to be specialty scissors.

However, the samples having a more balanced amount of titanium to chromium (e.g., samples 4, 5, and 9) had a satin silver appearance. Here, it has been determined that consumers recognized scissors 10 having a satin silver appearance as being for general household use and as having a coating.

Chromium is typically about 2.5 times more expensive than titanium. Thus, forming coating 32 of a majority of chromium leads to a substantial increase in cost, with only minimal gains in hardness. For example, coating 32 having 75% chromium and 25% titanium is about 95% as hard as a coating of 100% chromium.

It has also been found that the chromium nitride forms a strong bond to the blade, but does not form a strong bond with itself. For example, chromium nitride can form a strong bond with the chromium oxide of blade 22, 26, but does not form a strong bond with other chromium nitride molecules. Thus, the samples having a majority of chromium exhibited a higher tendency to peep than other samples having a minority of chromium.

The diffusion barriers properties exhibited by the samples having a majority of titanium were superior to those having less titanium. Thus, the samples having a majority of titanium exhibited better stain and corrosion resistance than other samples having a minority of titanium.

Coating 32 having the desired hardness, smoothness, and diffusion barrier properties preferably is formed of titanium chromium nitride having about 35 percent by weight of titanium nitride and about 65 percent by weight of chromium nitride and with a hardness in a range of about 5.7 to about 9.1 gigapascals. More preferably, coating 32 has about 50 percent by weight of titanium nitride and about 50 percent by weight of chromium nitride and a hardness in a range of about 7.2 to about 7.6 gigapascals.

It has been determined that coating 32 having the aforementioned ratios of chromium nitride and titanium nitride provided scissors 10 with a visual indication that the coating had been applied, without affecting the consumer's impression of the target use of the scissors (i.e., general household use). Moreover, coating 32 having the aforementioned ratios of chromium nitride and titanium nitride provided scissors 10 with drastically improved hardness over the uncoated sample 1.

The surface roughness of blades 22, 26 before and after the application of coating 32 was also measured. For example, the surface roughness of the outside surface of blades 22, 26 before coating 32 was in a range of about 20 to $25 \times 10^{-6}$ inch/inch after the coating was applied. It is believed that the roughness of blades 22, 26 was reduced because the molecules of coating 32 predominantly bond with the valleys and indentations in the blades.

Of course, it should be recognized that scissors 10 are described above by way of example only as having a coating applied by reactive magnetron sputtering and CAP processed. Any thin film forming method such as chemical vapor deposition, physical vapor deposition, thermal spraying and sintering after a dip coating may be employed for providing coating 32 to scissors 10. Preferably, the method of forming coating 32 has a maximum temperature sufficient to not soften or affect the heat-treatment of the uncoated blades.

It should also be recognized that coating 32 has been described above by way of example only as finding use with a cutting implement in the form of scissors 10. Of course, coating 32 can provide the aforementioned benefits to other stationary cutting implement. For example, FIGS. 6 to 9 illustrate alternate exemplary embodiments of cutting implements, which have a coating.

Figure 6:
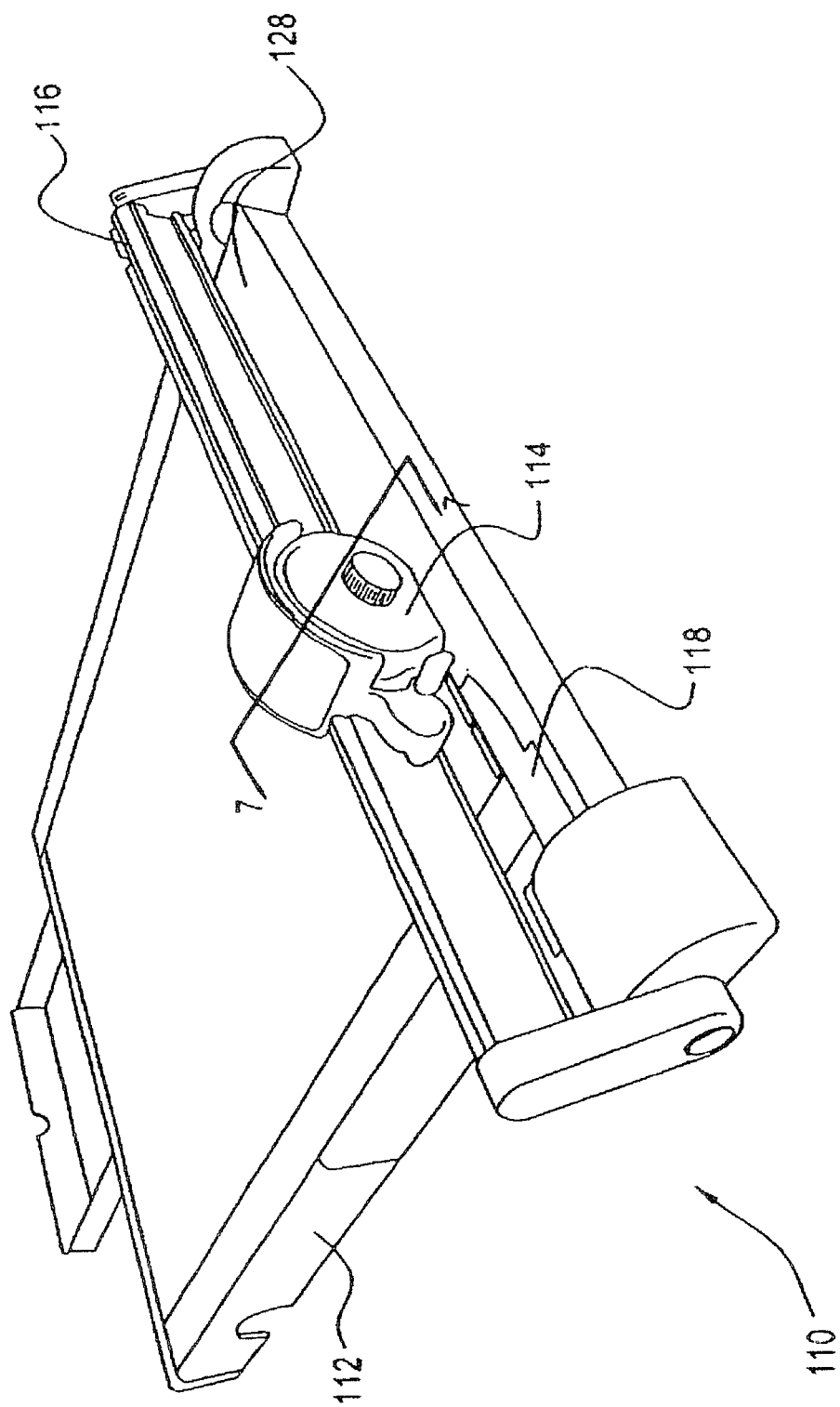
FIG. 6 is a perspective view of an exemplary embodiment of a rotary style paper trimmer.
Figure 7:
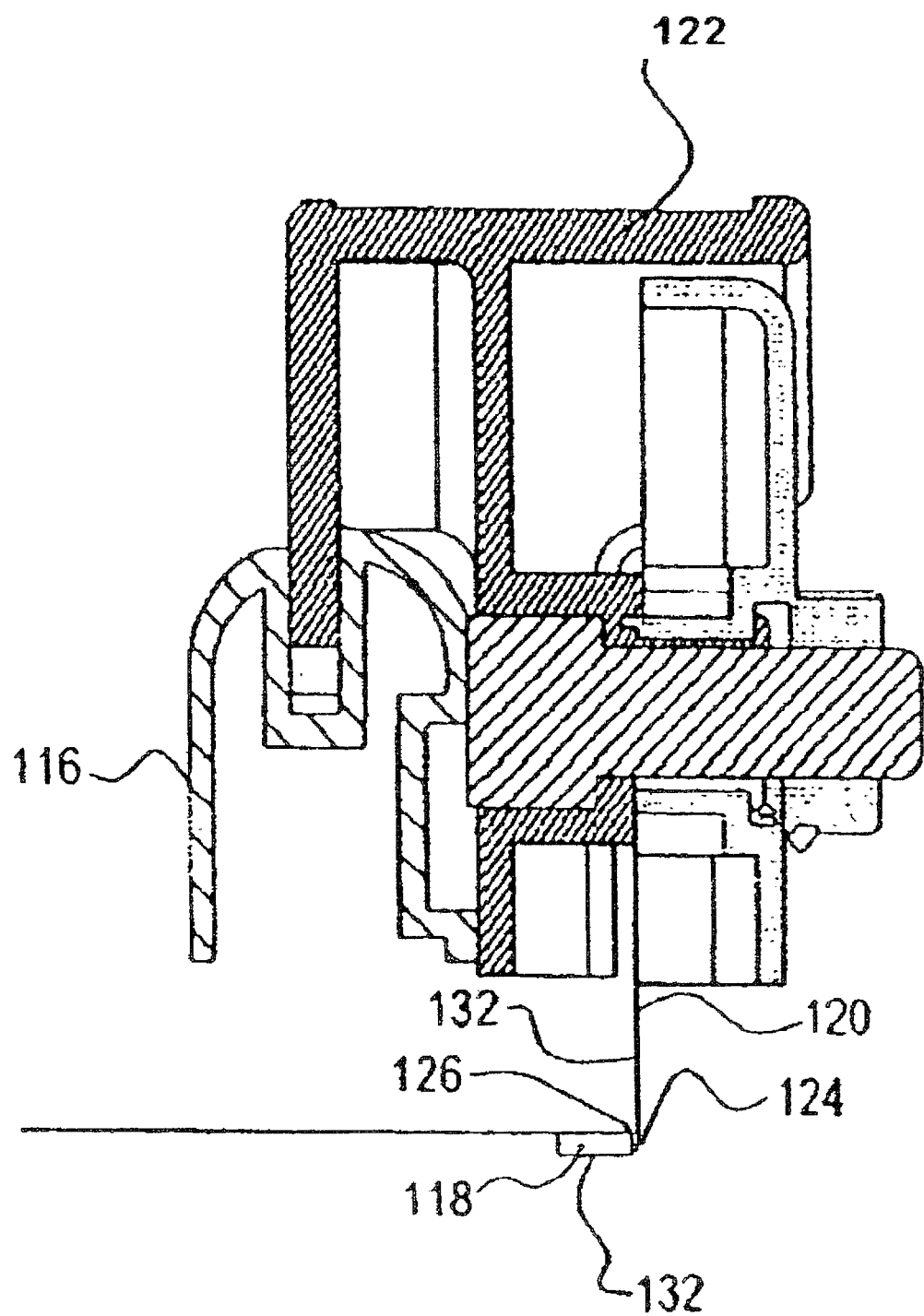
FIG. 7 is a sectional view along line 7-7 of FIG. 6.

An exemplary embodiment of a cutting implement in the form of a rotary style paper trimmer 110 is illustrated in FIGS. 6 and 7. Rotary style paper trimmer 110 is as shown and described in U.S. Provisional Application Ser. No. 60/421,581 filed on Oct. 28, 2002, the contents of which are incorporated herein by reference.

Trimmer 110 has a base 112 and a rotary cutting mechanism 114. Base 112 has a rail 116 and a cutting blade or anvil 118. Rotary cutting mechanism 114 has a circular cutting blade 120 disposed in a housing 122. Housing 122 is slideably received on rail 116.

Blade 120 is disposed in housing 122 opposite blade 118 as illustrated in FIG. 7. Blade 120 has a cutting edge 124 formed at its outer periphery, while blade 118 has a corresponding cutting edge 126. Rotary cutting mechanism 114 is also movably received on rail 116 such that cutting edges 124, 126 can be moved into contact with one another. Accordingly, trimmer 110 has a pair of complementary cutting blades 118, 120.

During use of trimmer 110, a piece of paper 128 is positioned between cutting edges 124, 126. Rotary cutting mechanism 114 is moved such that cutting edge 124 is contact with cutting edge 126. Then, rotary cutting mechanism 114 is slid along rail 116 such that the interaction of cutting edge 124 on cutting edge 126 severs paper 128 disposed therebetween.

Blades 118, 120 are preferably made of steel, more preferably stainless steel, such as 420 stainless steel. In addition, blades 118, 120 can be heat-treated to further increase the hardness of the complementary cutting blades.

Trimmer 110 has a coating 132 disposed on blades 118, 120. As described in detail above with respect to the exemplary embodiments of FIGS. 1 to 5, coating 132 has a thickness in a range between about 0.3 microns, more preferable about 0.1 microns.

Coating 132 provides the complementary cutting blades 118, 120 with extremely tough, hard, wear resistant characteristics. This increased hardness provides trimmer 110 with substantially increased longevity, while also providing the trimmer with corrosion resistance, as well as providing a smooth and uniform appearance and color. Coating 132 provides trimmer 110 with an aesthetically acceptable color or appearance and reduces friction between the cutting blades during use.

Coating 132 can be made of titanium nitride (TiN), chromium nitride (CrN), or titanium chromium nitride (TiCrN). More preferably, coating 32 is a multiple component barrier of titanium chromium nitride.

Coating 132 having the desired hardness, smoothness, and diffusion barrier properties preferably is formed of titanium chromium nitride having about 35 percent by weight of titanium nitride and about 65 percent by weight of chromium nitride and with a hardness in a range of about 5.7 to about 9.1 gigapascals. More preferably, coating 32 has about 50 percent by weight of titanium nitride and about 50 percent by weight of chromium nitride and a hardness in a range of about 7.2 to about 7.6 gigapascals. Thus, coating 132 provides trimmer 110 with a visual indication that the coating had been applied, without affecting the consumer's impression of the target use of the scissors (i.e., general household use). Moreover, coating 132 provides trimmer 110 with drastically improved hardness over uncoated trimmers.

Figure 8:
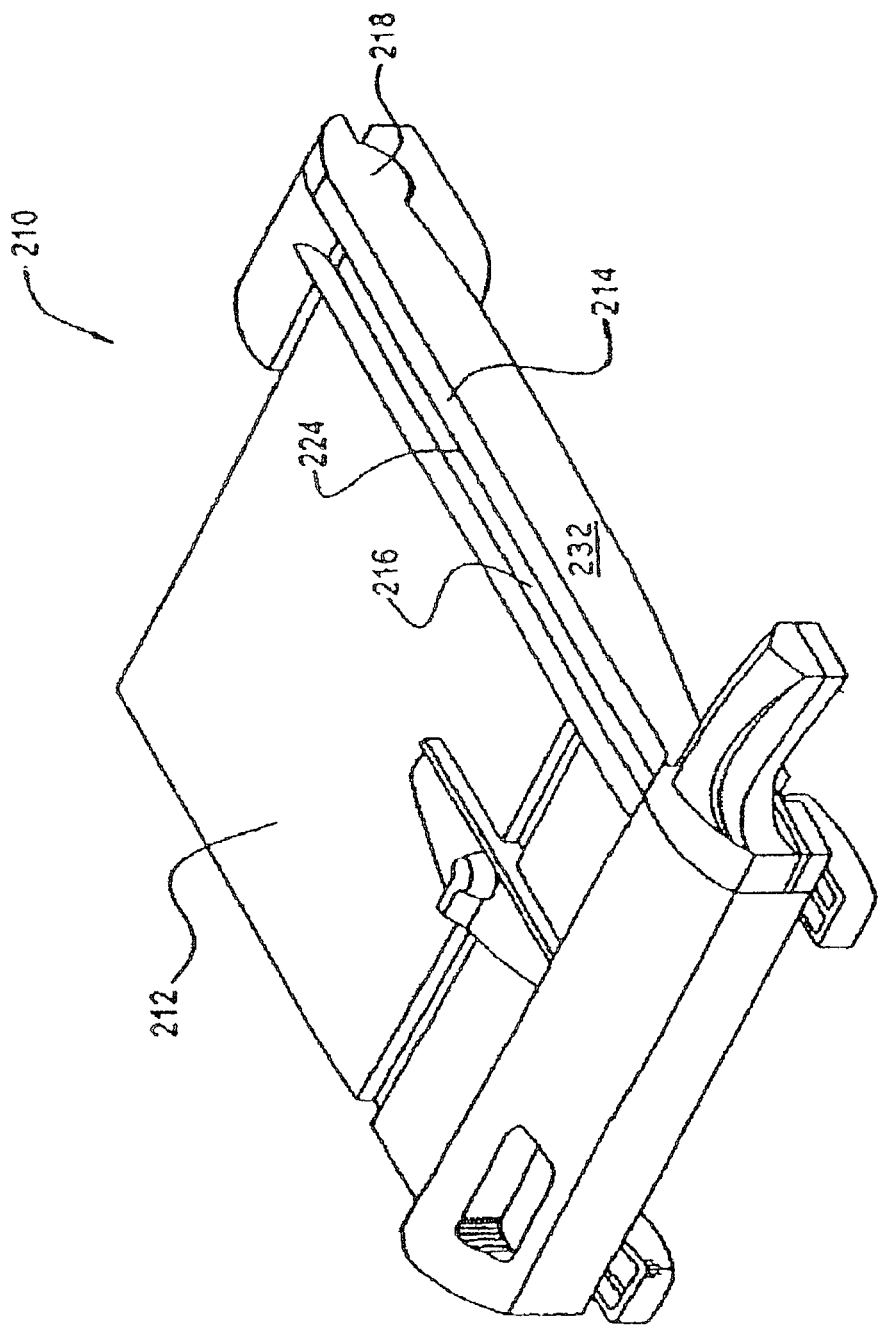
FIG. 8 is a perspective view of an exemplary embodiment of a guillotine style paper trimmer.
Figure 9:
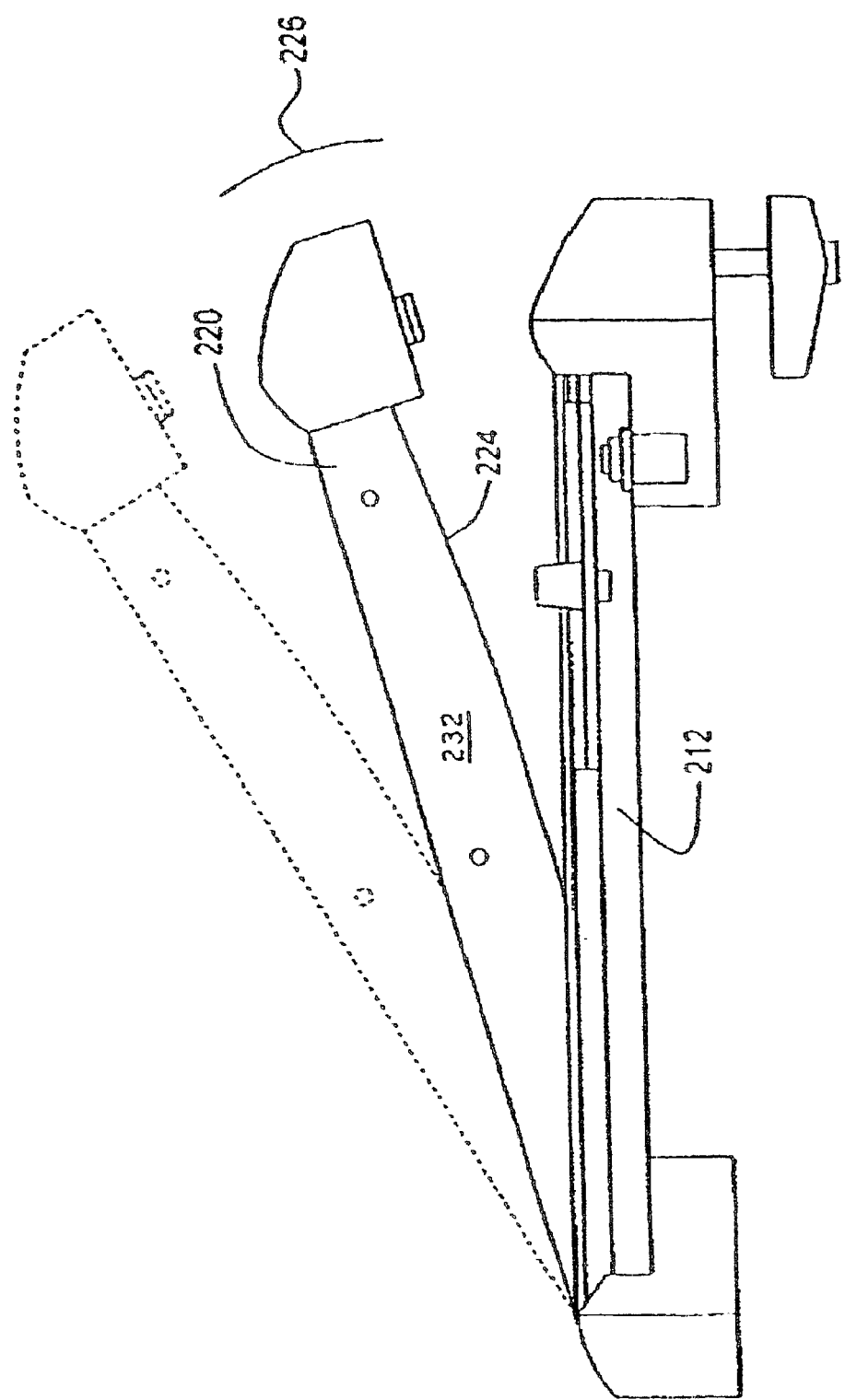
FIG. 9 is a side view of the guillotine style paper trimmer of FIG. 8.

An exemplary embodiment of a stationary cutting implement in the form of a guillotine style paper trimmer 210 is illustrated in FIGS. 8 and 9. Trimmer 210 is as shown and described in U.S. Provisional Application Ser. No. 60/392,942 filed on Jul. 1, 2002, the contents of which are incorporated herein by reference.

Trimmer 210 has a base 212 and a pivoting cutting mechanism 214. Base 212 has a fixed cutting blade 216. Pivoting cutting mechanism 214 has a movable cutting blade 220 pivotally secured to base 212 at a pivot point 218. Each blade 216, 220 has a cutting edge 224. Accordingly, trimmer 210 has a pair of complementary cutting blades 216, 220.

During use of trimmer 210, a piece of paper (not shown) is positioned on base 212 so that the portion to be cut is disposed between the cutting edges 224. Pivoting cutting mechanism 214 is moved about pivot point 218 in the direction of arrow 226 such that the cutting edges 224 shear the paper.

Cutting blades 216, 220 are preferably made of steel, more preferably stainless steel, such as 420 stainless steel. In addition, cutting blades 216, 220 can be heat-treated to further increase the hardness of the complementary cutting blades.

Trimmer 210 has a coating 232 disposed on cutting blades 216, 220. Again, coating 232 has a thickness in a range between about 0.3 microns and 0.5 microns, more preferably about 0.4 microns.

Coating 232, like coating 132, provides the complementary cutting blades with extremely tough, hard, wear resistant characteristics. This increased hardness provides trimmer 210 with substantially increased longevity, while also providing the trimmer with corrosion resistance, as well as providing a smooth and uniform appearance and color. Coating 232 provides trimmer 210 with an aesthetically acceptable color or appearance and reduces friction between the cutting blades during use.

Coating 232, like coating 132, can be made of titanium nitride (TiN), chromium nitride (CrN), or titanium chromium nitride (TiCrN). More preferably, coating 232 is a multiple component barrier of titanium chromium nitride. Coating 232 is formed of titanium chromium nitride having about 35 percent by weight of titanium nitride and about 65 percent by weight of chromium nitride and with a hardness in a range of about 5.7 to about 9.1 gigapascals. More preferably, coating 232 has about 50 percent by weight of titanium nitride and about 50 percent by weight of chromium nitride and a hardness in a range of about 7.2 to about 7.6 gigapascals.

The coating described herein for stationary cutting implements provides a cost competitive manner to improve the hardness, longevity, stain resistance, and ease of use of the cutting implement. For example, it has been found that the coating of the present invention, when applied using the aforementioned CAP process, increases the cost of the cutting implement by about seventeen cents, or less than 30% of the cost of manufacturing the implement.

Carbonitride Coating

Figure 10:
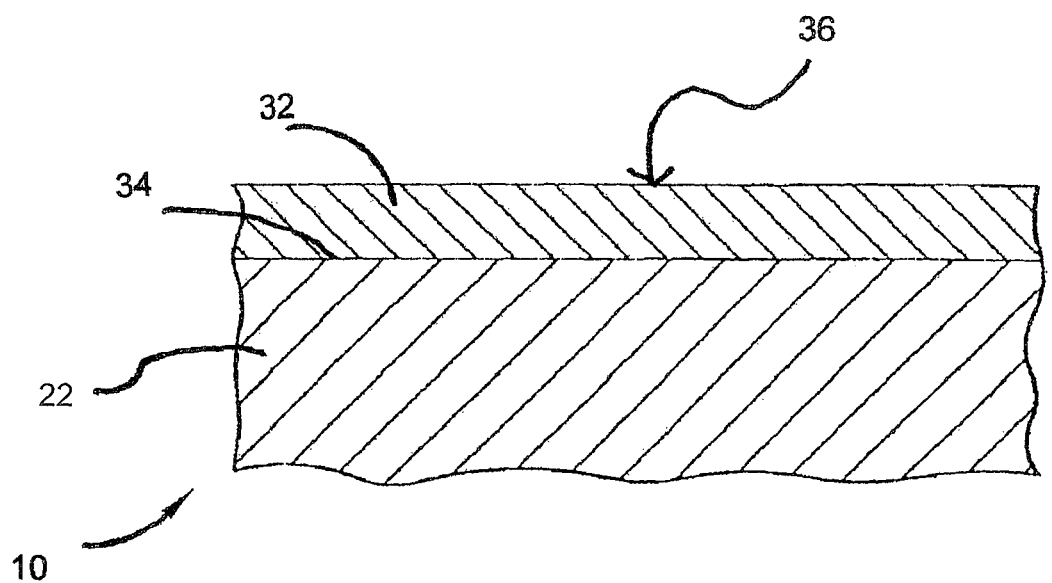
FIG. 10 is a cross sectional view of the cutting instrument in FIG. 1.

Referring to FIG. 10 a cross section of blade 22 portion is shown. A coating 32 is deposed on surface 34 of blade 22. The coating 32 is deposed on the blade substrate with a pre-defined target coating 32 thickness. The coating 32 thickness has a target range of about 0.05 microns to about 1.0 microns. In an alternative embodiment, the coating 32 has a thickness range from about 0.1 to about 0.6 microns. In yet another alternative embodiment, the coating 32 has a target range of about 0.3 microns to about 0.5 microns. The coating surface 36 is substantially parallel to the substrate surface 34. It is contemplated that the target thickness range can vary from about +/−0.02 microns to about +/−0.15 microns, depending upon the target thickness, and still be within an acceptable range of deviation. By example, with a target thickness of 0.5 microns the standard deviation can be +/−0.1 microns. The coating 32 covers the entire blade 22, 26 surface, as the cutting edge is formed prior to the coating process. In an alternative embodiment, the bevel 30 is not covered by the coating 32 as the bevel 30 is formed after the coating process has occurred. The cutting edge remains coated when the bevel 30 is created after the blades have undergone a coating process. The bevel can be created by a metal cutting or etching process.

Coating 32 provides the blades 22, 26 and cutting edges 28 with tough, hard, wear resistant characteristics. Based in-part upon these characteristics the instrument 10 has substantially increased longevity, while providing the instrument 10 with corrosion resistance, as well as providing a smooth and uniform appearance and color.

Various embodiments of the present invention provide the scissors 10 with an aesthetically acceptable color or appearance, while indicating to the consumer an often identifiable distinction from known non-coated instruments. Additionally, various embodiments of the present invention are improvements upon known coatings. Samples 15 and 19 (See FIG. 11) represent coatings previously described within U.S. Pat. No. 6,988,318. Various embodiments of the present invention have increased hardness over previously known coatings while maintaining enhanced toughness and expressing increased wear-resistance over non-coated cutting instruments.

The coating 32 increases the ease of use for the scissors 10 by providing the blades 22, 26 with a smooth surface finish, thereby reducing the friction between the blades during use. There is also reduced friction between each blade 22, 26 and the material being cut, thereby providing a smooth cutting action with less cutting effort than blades with out a coating 32. Although there is reduced friction between the blades 22, 26, the coating 32 adheres strongly to the underlying blade substrate surface 34. The coating 32 provides high toughness, low friction and high adhesion strength with the substrate. Various embodiments of the present coating 32 present high toughness based upon the absence of cracking after nanoindentation tests are performed. Alternatively, the coating 32 forms a metallurgical bond with the substrate 22.

Materials cut by the cutting instrument 10 vary widely based upon the desired use of the instrument 10 and the particular coating composition can be altered to be best suited for that particular purpose. For example, the material to be cut can be selected from stationery products including paper, cardboard, bristol board and other fibrous stationary materials. By further example, the material to be cut can be selected from floral-based biomaterials including stems, leaves, twine, and porous wood materials. The coating 32 can be optimized for hardness and resistant to wear in the presence of semi-hard cutting materials and moisture. By further example, the material to be cut can be selected from man-made materials having cured or uncured adhesives.

It is further contemplated that the instrument 10 is not a pair of scissors. The instrument 10 can alternatively be a single blade cutting instrument. By example, the cutting instrument 10 can be selected from a paper trimmer, hobby knife, letter opener, utility knife, pencil sharpener, or rotary paper trimmer. The instrument 10 can be selected from a variety of cutting instruments for which wear resistance, toughness, and hardness improve the operability of the instrument.

Deposition of the coating 32 can be performed through a variety of reactive magnetron sputtering steps. A pulsed direct current (DC) source is utilized. The target size is approximately a 4-inch circular target. The targets are manufactured through combination of titanium and chromium targets in combination of sectors at a 90° angle. The sputtering gas mixture consists of argon, methane and nitrogen. The partial pressure of argon is maintained at approximately 1 millitorr. The partial pressure of nitrogen is maintained at approximately 1 millitorr while the methane gas pressure is maintained at approximately 2 millitorr. The total gas pressure is maintained at approximately 4 millitorr.

Now referring to FIGS. 11A-11E, various coating 32 composition data is represented. FIGS. 11A-11E represent a variance in the relative percentage of methane gas ($CH_4$) and nitrogen gas ($N_2$) within the methane/nitrogen mixture. The variances including about 0% methane ($CH_4$) and about 100% nitrogen ($N_2$), about 33% methane and about 67% nitrogen, about 66% methane and about 34% nitrogen, and about 100% methane and about 0% nitrogen. In an alternative embodiment of the present invention it is contemplated that the methane percentage can range from about 0% to about 100% and the nitrogen percentage can range from about 100% to about 0%. It is further contemplated that the gas mixture includes a gas other than nitrogen and methane. In an alternative embodiment acetylene gas ($C_2H_2$) replaces methane as a carbon source. In yet another alternative embodiment ammonia gas ($NH_3$) replaces nitrogen gas as the nitrogen source.

The sputtering current is maintained at approximately 0.4 amps during the cleaning process, which was completed in approximately 5 minutes. In an alternative embodiment the cleaning process is completed in less than 5 minutes or greater than 5 minutes. The target blades were not coated during the cleaning process due to the use of a shutter, which was withdrawn shortly after the target blades were cleaned. The sputtering current is maintained at a substantially constant level during the coating deposition process. The sputtering current level is maintained at about 0.6 to about 0.7 amps. In an alternative embodiment, the sputtering current is maintained at approximately a constant level, the level can range from about 0.2 amps to about 0.6 amps during the cleaning process. In yet another alternative embodiment, the cleaning process is performed in less than 5 minutes. In yet another alternative embodiment, the deposition current is maintained at a substantially constant level. Alternatively, during the deposition process the level of the current can range from about 0.4 to about 1.0 amps.

During the deposition process the sputtering time is about 20 minutes. The resulting thickness of the coatings is in a range of about 0.4 microns to about 0.5 microns. In an alternative embodiment the coating thickness is in a range of about 0.05 microns to about 1.0 microns. In yet another alternative embodiment, the sputtering deposition time ranges from about 1 minute to about 1 hour. Depending upon the desired target thickness of the coating, the deposition time can be varied to accomplish the target thickness of the coating 32. Alternatively, a thin coating can be applied by limiting the deposition time to less than 20 minutes.

Deposition of the coatings occurs at about 250° C. and the temperature is maintained at substantially the same level. In an alternative embodiment the temperature at which deposition takes place ranges from about 150° C. to about 320° C. In yet another alternative embodiment the temperature at which deposition occurs is greater than about 320° C. In an alternative embodiment the temperature level is varied during the process, with at least two different temperature targets during the deposition process. Alternatively, the temperature at which deposition takes place can be less than 150° C.

In an alternative embodiment, deposition of the coating can be performed by cathode arc plasma (CAP) process with the sputtering gas mixture chosen from the group including argon, nitrogen, methane, acetylene, and ammonia. Two different targets can be used that contain chromium and titanium for the CAP process. It is further contemplated that similar metals can be used. In yet another alternative embodiment, the deposition of the coating 32 can be applied by a process selected from the group including chemical vapor deposition, physical vapor deposition, thermal spraying, or sintering after dip coating.

In an alternative embodiment of the deposition method the partial pressure of methane is maintained at approximately 1 millitorr while the partial pressure of nitrogen is maintained at approximately 2 millitorr. The total gas pressure is also maintained at approximately 4 millitorr.

Hardness of the coating was performed using a nanoindentation procedure. A Hysitron Triboindenter (Hysitron Inc., Minneapolis, Minn.) was used for nanoindentation testing. A Berkowitz indentor was utilized in conjunction with the Hysitron nanoindentor. A measurement of the nanohardness (GPa) and modulus (GPa) was obtained for each sample tested. The hardness and modulus values are shown in FIGS. 11A-11E.

Each of the various coating compositions identified in FIGS. 11A-11E has a relative color assigned to it. The term "medium" in conjunction with a color identifier describes a darker shade than that color identifier alone. By example, medium silver is darker than silver alone. Bronze is used synonymously with dark golden. Similarly, "blue silver" is a silver modified by the color blue to indicate that the silver color has a bluish tint.

The sample coatings were deposed on polished silicon wafers. The wafers allow for a significantly smooth substrate, which allows for more accurate nanoindentation hardness values. Due to the size of the indenter, a relatively rough surface would cause an unsuitable angle of indentation incidence, which in turn affects the hardness data obtained by nanoindentation. Accurate hardness measurements are obtained through nanoindentation procedures regardless of the substrate so long as the substrate has a substantially smooth surface, as the indenter does not penetrate through the coating 32 into the substrate 22. Nanoindentation allows for data to be obtained for the coating irrespective of the substrate, therefore the use of silicon wafers rather than steel substrates does not affect the testing data obtained. The use of polished silicon wafers as a coating substrate is an accepted procedure for accurate nanoindentation coating tests.

Testing was performed on a variety of coated blade samples. The results of the testing are provided in FIGS. 11A-11E. Testing was performed on 20 coated samples. Each of the samples had a different target coating chemistry. FIGS. 11A-11E corresponds to Tables 1-5, each with a different relative ratio of chromium to titanium. By example, Table 2 samples have a relative ratio of 0.75 chromium to 0.25 titanium, and Table 3 samples have a relative ratio of 0.5 chromium to 0.5 titanium. Table 1 samples have no titanium present and Table 5 samples have no chromium present. Within each table there are four samples, which were varied by the ratio of carbon to nitrogen. Methane ($CH_4$) gas was used as a carbon source, and nitrogen ($N_2$) gas was used as a source of nitrogen. The relative ratios of carbon to nitrogen included the following ratios: 0:1, 1:3, 2:3, and 1:0. Nanohardness measurement and modulus measurements were obtained for each of the 20 samples, and provided in the respective tables. Alternatively, the relative ratio of carbon to nitrogen can be 1:1. In an alternative embodiment it is contemplated that the relative ratio of carbon to nitrogen can range from about 0:1 to about 1:0. In yet another alternative embodiment it is contemplated that the relative ratio of nitrogen to carbon can range from about 0:1 to about 1:0.

Coating 32 has increased toughness, hardness and wear-resistance over what has been previously known. The coating 32 has a hardness value of about 32.2 gigapascals (GPa) and a modulus of about 259 GPa. The coating 32 comprises an amorphous material including the elements chromium, titanium, carbon, and nitrogen in a relative ratio of about 3 parts chromium to about 1 part titanium. This relative ratio is depicted in FIG. 11B as 0.75 chromium and 0.25 titanium. The coating 32 forms a tight bond with the underlying steel substrate, thereby increasing toughness and reducing flaking. The coating 32 can contain multiple chemical compounds, the compounds being selected from a group including titanium nitride (TiN), chromium nitride (CrN), titanium carbonitride (TiCN), chromium carbonitride (CrCN), titanium carbide (TiC), chromium carbide (CrC), titanium chromium carbonitride (TiCrCN), titanium chromium nitride (TiCrN), and titanium chromium carbide (TiCrC). Alternatively the coating 32 has a hardness in a range of about 30 GPa to about 40 GPa.

In an alternative embodiment, the coating 32 has a hardness in the range of about 10 GPa to about 20 GPa. The coating 32 comprises an amorphous material including the elements titanium and chromium in relative ratio of about equal parts titanium to about equal parts chromium and represented as 0.5 titanium to 0.5 chromium in FIG. 11C. The coating alternatively has a hardness of about 12 GPa. The coating 32 alternatively has a hardness of about 12 GPa. Carbon and nitrogen sources are present in a relative ratio of about 2 parts methane gas to about 1 part nitrogen gas when coating deposition occurs upon the blade 22, 26. Alternatively, the relative ratio is about 1 part methane gas to about 2 parts nitrogen gas. The present embodiment of the coating 32 contains multiple chemical compounds, the compounds being selected from a group including titanium nitride (TiN), chromium nitride (CrN), titanium carbonitride (TiCN), chromium carbonitride (CrCN), titanium carbide (TiC), chromium carbide (CrC), titanium chromium carbonitride (TiCrCN), titanium chromium nitride (TiCrN), and titanium chromium carbide (TiCrC).

In yet another alternative embodiment the coating 32 comprises an amorphous material including the elements chromium, nitrogen and carbon. The coating 32 has a hardness in a range of about 20 GPa to about 25 GPa. The carbon source is methane gas ($CH_4$) and the nitrogen source is nitrogen gas ($N_2$). Alternatively the carbon source is acetylene ($C_2$ and the nitrogen source is ammonia gas ($NH_3$). The coating 32 contains multiple chemical compounds, the compounds being selected from a group including chromium nitride (CrN), chromium carbonitride (CrCN), and chromium carbide (CrC). Alternative elements can be included as part of the coating composition.

In another alternative embodiment, the coating 32 comprises an amorphous material including the elements chromium, titanium, carbon, and nitrogen. The coating 32 comprises titanium and chromium in relative ratio of about three (3) parts titanium to about one (1) part chromium and represented as 0.75 titanium to 0.25 chromium in FIG. 11D. The coating 32 has a hardness value within a range of about 10 GPa to about 20 GPa. The coating alternatively has a hardness of about 13 GPa. The coating 32 alternatively has a hardness of about 16 GPa. Carbon and nitrogen sources are present in a relative ratio of about 2 parts methane gas to about 1 part nitrogen gas when coating deposition occurs upon the blade 22, 24. Alternatively, the relative ratio is about one (1) part methane gas to about two (2) parts nitrogen gas. The present embodiment of the coating 32 contains multiple chemical compounds, the compounds being selected from a group including titanium nitride (TiN), chromium nitride (CrN), titanium carbonitride (TiCN), chromium carbonitride (CrCN), titanium carbide (TiC), chromium carbide (CrC), titanium chromium carbonitride (TiCrCN), titanium chromium nitride (TiCrN), and titanium chromium carbide (TiCrC).

In yet another alternative embodiment, the coating 32 comprises an amorphous material including the elements titanium, chromium and carbon. The coating 32 comprises titanium and chromium in relative ratio of about equal parts titanium to about equal parts chromium having a hardness of about 26 GPa, and represented as 0.5 titanium to 0.5 chromium in FIG. 11C. Alternatively, the coating 32 comprises titanium and chromium in relative ratio of about three (3) parts titanium to about one (1) part chromium having a hardness of about 35 GPa, and represented as 0.75 titanium to 0.25 chromium in FIG. 11D. The present embodiment of the coating 32 contains multiple chemical compounds, the compounds being selected from a group titanium carbide (TiC), chromium carbide (CrC), and titanium chromium carbide (TiCrC).

In an alternative embodiment, the metal substrate undergoes a polishing step prior to deposition of the coating. The substrate polishing allows for thinner coating thicknesses to be utilized while maintaining complete and uniform deposition. It is contemplated that coating thicknesses can be in a range of about 0.05 microns to about 0.5 microns and the hardness of the coatings provide enhanced qualities at the thinner coating thicknesses.

Figure 12:
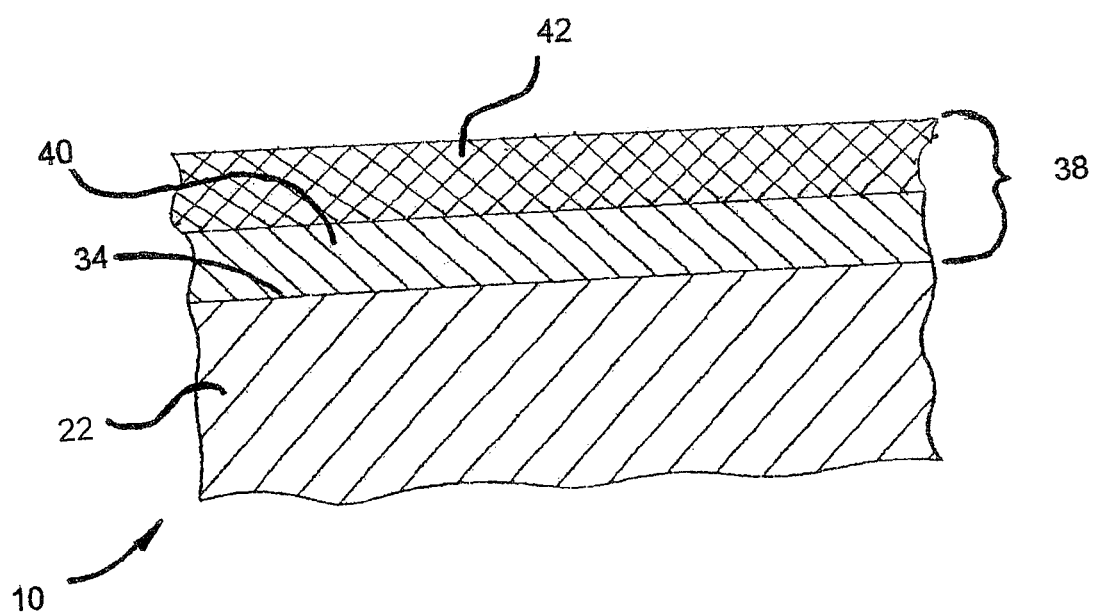
FIG. 12 is a cross sectional view of an alternative embodiment of the present invention, the coating having two layers.

Referring to FIG. 12, a two-layered alternative embodiment coating 38 is shown on a substrate 22. The coating 38 has a first layer 40 and a second layer 42. Each layer 40, 42 comprises an amorphous material including the elements chromium, titanium, carbon, and nitrogen. Layers 40, 42 have varying compositions as the reactive magnetron sputtering process is altered during the deposition process in order to form more than one layer. The present embodiment has a first layer 40 comprising chromium and titanium with a relative ratio of equal parts titanium and chromium. The second layer 42 comprises chromium and titanium in a relative ratio of 3 parts chromium to 1 part titanium. Each layer 40, 42 has a thickness in a range of about 0.02 microns to about 0.5 microns. The layers 40, 42 have a combined thickness in a range of about 0.05 microns to about 1.0 microns. The present embodiment of the coating 38 contains multiple chemical compounds, the compounds being selected from a group including titanium nitride (TiN), chromium nitride (CrN), titanium carbonitride (TiCN), chromium carbonitride (CrCN), titanium carbide (TiC), chromium carbide (CrC), titanium chromium carbonitride (TiCrCN), titanium chromium nitride (TiCrN), and titanium chromium carbide (TiCrC). Alternatively, the layers 40, 42 have a combined thickness in a range of about 0.3 to about 0.5 microns.

Figure 13:
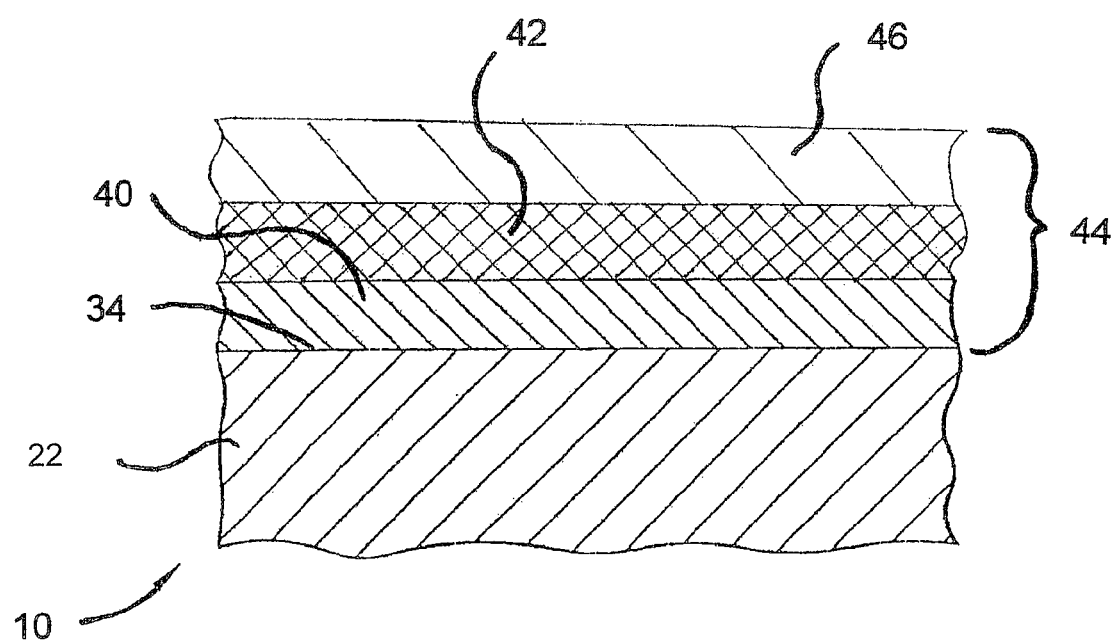
FIG. 13 is a cross sectional view of an alternative embodiment of the present invention, the coating having three layers.

Referring to FIG. 13, a three-layered alternative embodiment coating 44 is shown on substrate 22. The coating 46 has a first layer 40, a second layer 42, and a third layer 46. At least one layer 40, 42, 46 comprises an amorphous material including the elements chromium, titanium, carbon, and nitrogen. Alternatively, the coating 44 has more than 3 layers, the coating 44 having a thickness in a range of about 0.05 microns to about 1.0 microns. Alternatively, the coating 44 has a thickness in a range of about 0.3 to about 0.5 microns.

In an alternative embodiment, the coating of FIG. 13 is the same as the coating of FIG. 12, with the exception that third layer 46 is an outer layer of silicon applied on top of the second layer 42. An outer layer 46 of silicon can provide enhanced lubricity and release qualities for the coating 44. Alternatively, the outer layer 46 can have a variety of materials with the property to achieve lubricity, color, or thermal resistance.

In an alternative embodiment the layers can be altered by removing either the nitrogen source or the carbon source. In the event that the nitrogen source is removed for any one layer 40, 42, 46 there will not be any nitride formation for that particular layer 40, 42, 46. In the event that the carbon source is removed, then there will not be any carbide or carbonitride formation for that particular layer 40, 42, 46. Alternatively, the relative ratios of carbon and nitrogen can be dynamically altered during the deposition process to create a layering effect. The relative rations of carbon and nitrogen can be altered by dynamically controlling the sources, which can be selected from a group including methane gas, nitrogen gas, acetylene gas, and ammonia gas. Each layer 40, 42, 46 can have the same or varied thickness, the thickness being dependent upon the amount of time for each layering deposition process. The instrument 10 remains within the coating chamber throughout the multilayer coating process. Alternatively, the first layer 40 can be applied to the instrument 10 at a different point in time from that of additional layers 42, 46. By example, the cutting instrument can be coated, sharpened and then re-coated. The final coating 46 having a thickness that provides wear-resistance and hardness while maintaining a desired level of blade sharpness.

It should also be noted that the terms "first", "second", and "third" and the like may be used herein to modify various elements. These modifiers do not imply a spatial, sequential, or hierarchical order to the modified elements unless specifically stated.

While the invention has been described with reference to one or more exemplary embodiments, it will be understood by those skilled in the art that various changes may be made and equivalents may be substituted for elements thereof without departing from the scope of the invention. In additions, many modifications may be made to adapt a particular situation or material to the teachings of the disclosure without departing from the essential scope thereof. Therefore, it is intended that the invention not be limited to the particular embodiment(s) disclosed as the best mode contemplated for carrying out this invention, but that the invention will include all embodiments falling within the scope of the appended claims.

What is claimed:

1. A method comprising:
    obtaining a cutting instrument having a cutting blade comprising steel,
    placing the cutting instrument in a position suitable for coating the cutting blade;
    cleaning the cutting blade; and
    depositing a single coating layer on the cutting blade, the coating layer comprising an amorphous material including chromium, titanium, carbon and nitrogen and being deposited directly on the cutting blade using physical vapor deposition, the overall thickness of the coating layer being in the range of 0.1 microns to 0.6 microns,
    wherein at least some of the chromium is in the form chromium carbonitride and titanium chromium carbonitride and at least some of the titanium is in the form of titanium carbonitride, and
    wherein the coating comprises chromium and titanium in a weight ratio in the range of 3:1 to 1:3.

2. The method of claim 1, wherein the coating is deposited by reactive magnetron sputtering.

3. The method of claim 1, wherein the coating has a nanoindentation hardness, as measured on a polished silicon wafer, of about 20 GPa to about 35.2 GPa.

4. The method of claim 1, wherein the coating has a nanoindentation hardness, as measured on a polished silicon wafer, of about 32 GPa to about 35.2 GPa.

5. The method of claim 1, wherein the coating has a nanoindentation hardness in the range of 12 GPa to 35.2 GPa.

6. The method of claim 1, wherein the coating has a nanoindentation hardness in the range of 26.3 GPa to 35.2 GPa.

7. The method of claim 1, wherein the coating comprises the elements chromium and titanium in a weight ratio of 1:1 to 3:1.

8. The method of claim 1, wherein the coating is deposited by a cathode arc plasma process.

9. A cutting instrument comprising:
    a cutting blade comprising steel; and
    a sputtered coating having only a single layer disposed directly on the cutting blade, the coating having a thickness of 0.1 to 0.6 microns and comprising an amorphous material including titanium, chromium, carbon and nitrogen, the titanium and chromium being present in a weight ratio in the range of 3:1 to 1:3,
    wherein at least some of the chromium is in the form chromium carbonitride and titanium chromium carbonitride and at least some of the titanium is in the form of titanium carbonitride.

10. The cutting instrument of claim 9, wherein the coating has a nanoindentation hardness, as measured on a polished silicon wafer, of about 20 GPa to about 35.2 GPa.

11. The cutting instrument of claim 9, wherein the coating has a nanoindentation hardness, as measured on a polished silicon wafer, of about 32 GPa to about 35.2 GPa.

12. The cutting instrument of claim 9, wherein the coating has a nanoindentation hardness in the range of 12 GPa to 35.2 GPa.

13. The cutting instrument of claim 9, wherein the coating has a nanoindentation hardness in the range of 26.3 GPa to 35.2 GPa.

14. The cutting instrument of claim 9, wherein the cutting instrument has first and second complementary cutting blades.

15. The cutting instrument of claim 9, wherein the coating comprises the elements chromium and titanium in a weight ratio of 1:1 to 3:1.

16. A method comprising:
obtaining a cutting instrument having a cutting blade comprising steel;
placing the cutting instrument in a position suitable for coating the cutting blade;
cleaning the cutting blade;
depositing a first coating layer comprising an amorphous material including chromium, titanium, carbon and nitrogen directly on the cutting blade using physical vapor deposition, and
depositing a second coating layer comprising an amorphous material including chromium, titanium, carbon and nitrogen on the first coating layer using physical vapor deposition, the second coating layer having an inner surface in direct contact with the first coating layer and an opposite outer surface,
wherein
at least some of the chromium in each layer is in the form chromium carbonitride and titanium chromium carbonitride and at least some of the titanium is in the form of titanium carbonitride,
the first and second coating layers each comprise chromium and titanium in a weight ratio in the range of 3:1 to 1:3,
the second coating layer has a higher ratio of chromium to titanium than the first layer, and
the overall thickness of the first and second coating layers is in the range of 0.1 microns to 0.6 microns.

17. The method of claim 16, wherein the coating is deposited by reactive magnetron sputtering.

18. The method of claim 16, wherein the second coating layer has a nanoindentation hardness, as measured on a polished silicon wafer, of about 20 GPa to about 35.2 GPa.

19. The method of claim 16, wherein the each of the first and second layers of the coating comprises the elements chromium and titanium in a weight ratio of 1:1 to 3:1.

* * * * *